(12) United States Patent
Hieda et al.

(10) Patent No.: US 6,414,432 B1
(45) Date of Patent: Jul. 2, 2002

(54) ORGANIC EL DEVICE AND METHOD FOR MANUFACTURING SAME

(75) Inventors: Shigeru Hieda; Yukio Ogawa, both of Mobara (JP)

(73) Assignee: Futaba Corporation, Mobara (JP)

( * ) Notice: Subject to any disclaimer, the term of this patent is extended or adjusted under 35 U.S.C. 154(b) by 0 days.

(21) Appl. No.: 09/501,191

(22) Filed: Feb. 10, 2000

(30) Foreign Application Priority Data

Feb. 15, 1999 (JP) .............................................. 11-035821

(51) Int. Cl.[7] .............................. H01J 1/62; H01J 63/04
(52) U.S. Cl. ........................ 313/506; 313/505; 313/509; 428/917
(58) Field of Search ................................. 313/505, 509, 313/506, 504; 428/917

(56) References Cited

U.S. PATENT DOCUMENTS 5,804,917 A 9/1998 Takahashi et al. .......... 313/504
6,087,772 A * 7/2000 Ootsuki et al. ............. 313/505
6,107,736 A * 8/2000 Shi et al. .................... 313/509

* cited by examiner

Primary Examiner—Sandra O'Shea
Assistant Examiner—Ali Alavi
(74) Attorney, Agent, or Firm—Oblon, Spivak, McClelland, Maier & Neustad, P.C.

(57) ABSTRACT

An organic EL device capable of ensuring reliable and easy insulation between electrodes during patterning of the electrodes. The organic EL device includes an organic EL layer including a luminous layer and arranged between anodes and cathodes, as well as electrode separation sections arranged so as to separate the anodes from each other while insulating them from each other. The electrode separation sections each include a plurality of insulating ribs juxtaposed to each other at predetermined intervals and arranged on the anodes or in proximity to a periphery of the anodes. This permits the interval between the ribs juxtaposed to each other to prevent the material for the second electrodes from advancing through the top surface of the ribs to the side surface thereof, to thereby ensure positive insulation between the second electrodes.

7 Claims, 5 Drawing Sheets

ORGANIC EL DEVICE AND METHOD FOR MANUFACTURING SAME

BACKGROUND OF THE INVENTION

This invention relates to an organic electroluminescent (hereinafter referred to as "EL") device and a method for manufacturing the same, and more particularly to an organic EL device constructed of a thin film of an organic compound material emitting light due to injection of positive holes and electrons and recombination therebetween while utilizing electroluminescence of the organic compound material, and a method for manufacturing the same.

An organic EL device is constructed into a laminate structure in which a thin film containing a fluorescent organic compound is interposed between anodes and cathodes. In the organic EL device thus constructed, positive holes and electrons are injected into the thin film, to thereby be recombined together, leading to production of excitons, resulting in display being carried out utilizing light (fluorescence, phosphorescence or the like) emitted from the excitons during deactivation thereof.

Now, a conventional organic EL device will be described with reference to FIG. 6.

An organic EL device designated at reference numeral 101 includes a glass substrate 102 made of an insulating and transparent material, on which anodes 103 in the form of a transparent conductive film made of indium tin oxide (ITO) are arranged in a predetermined pattern such as, for example, a stripe-like pattern. The organic EL device also includes an organic EL layer 105 formed of a thin film made of an organic compound and arranged on the anodes 103. The organic EL layer 105 includes a luminous layer. The organic EL layer 105 is formed thereon with cathodes 106, which are made of a thin film of metal such as Al—Li or the like and arranged on the organic EL layer 105 in a predetermined pattern. The cathodes 106 may be arranged in, for example, a stripe-like pattern which cooperates with the stripe-like pattern of the anodes 103 to define a matrix.

In the organic EL device thus constructed, the cathodes 106 are typically formed by PVD such as molecular beam deposition, resistance heating or the like. In the conventional organic EL device shown in FIG. 6, the organic EL layer 105 is covered on a portion thereof on which the cathodes 106 are not to be arranged with masks 112 during formation of the cathodes 106, so that deposition of the cathodes 106 is carried out from above the masks 112. This permits the cathodes 106 to be formed on a portion of the organic EL layer 105 which are not covered with the masks 112, leading to patterning of the cathodes 106.

Unfortunately, formation of the cathodes 106 using the masks 112 requires to increase both dimensional accuracy of the masks 112 and accuracy of positioning of the masks 112 necessary to positionally correspond the cathodes 106 to the anodes 103. In particular, information of a fine pattern wherein the cathodes 106 are arranged in a complicated manner rather than the above-described stripe-like manner defining the matrix, it is required to further increase dimensional accuracy of the masks 112.

Also, formation of the cathodes 106 by means of the masks 112 tends to cause a material for the cathodes 106 to enter or intrude into a portion of the organic EL layer 105 on which formation of the cathodes is not desired such as the portion of the organic EL layer 105 covered with the masks 112 and the like during formation of the cathodes 106. This often leads to short-circuiting between the cathodes 106 which must be electrically separated from each other.

In order to solve the problem, it is proposed to arrange a rib 109 between each adjacent two of the cathodes 106 to separate the cathodes from each other for insulation therebetween, as shown in each of FIGS. 7(a) to 7(c).

In FIG. 7(a), the anodes 103 are previously formed thereon with the ribs 109 and then the organic EL layer 105 is formed on the anodes 103, followed by formation of the cathodes 106. The cathodes 106 are deposited on the organic EL layer 105 while being separated from each other through the ribs 109. Such formation of the cathodes 106 by means of the ribs 109 increases both dimensional accuracy and positioning accuracy of the cathodes as compared with those by means of the masks 112.

However, in formation of the cathodes 106 using the ribs 109 shown in FIG. 7(a), the cathodes which must be separated from each other on both sides of each of the ribs 109 fail to be separated from each other due to adhesion of the cathode material to the rib 109. In order to solve the problem, ribs 109 shown in FIGS. 7(b) and 7(c) are proposed for formation of the cathodes 106.

The rib 109 shown in FIG. 7(b) is formed into a downwardly or invertedly tapered shape in section to prevent the cathode material from reaching a lower portion of the rib 109. Alternatively, the rib 109 may be formed into a T-like shape in section rather than the invertedly tapered shape, resulting in a shade being formed under the rib 109.

The rib 109 shown in FIG. 7(c) is formed into an increased height, so that the cathode material may be obliquely deposited on the organic EL layer 105 from one side of the rib 109. This permits the cathode,106 to be satisfactorily blocked on the other side of the rib 109.

In the rib 109 shown in FIG. 7(b) proposed in order to improve the rib of FIG. 7(a), although the invertedly tapered configuration of the rib 109 effectively prevents the cathode material from reaching the shade under the rib 109, it fails to permit the organic EL layer 105 formed prior. to formation of the cathodes 109 to be formed on the shade of the rib 109. Thus, when the cathode material intrudes into a portion of the anodes on which the organic EL layer 105 fails to be formed, short-circuiting occurs between the anodes 103 and the cathodes 106. Thus, the rib 109 shown in FIG. 7(b) requires to rotate the substrate 102 during formation of the organic EL layer 105, to thereby permit an organic material for the organic EL layer 105 to be deposited under the rib 109. Also, in the rib 109 of FIG. 7(b), it is required to subject the rib 109 to etching to form it into the invertedly tapered shape after such arrangement of the rib 109 on the anode 103 as shown in FIG. 7(a).

In the rib 109 shown in FIG. 7(c), an increase in height of the ribs 109 and oblique deposition of the cathodes 106 on the organic EL layer 105 cooperate with each other to separate the cathodes 106 from each other. However, requirements on an aspect ratio (height/width) in section of the rib 109 renders an increase in height of the rib substantially difficult. Also, the oblique deposition causes a direction in which patterning of the ribs 109 is carried out to be limited to only a vertical direction or a manner in which the patterning is carried out to be limited to only a stripe-like manner, to thereby fail to provide complicated patterning of the ribs 109 which permits bending or meandering of the cathodes 106.

SUMMARY OF THE INVENTION

The present invention has been made in view of the foregoing disadvantage of the prior art.

Accordingly, it is an object of the present invention to provide an organic EL device which is capable of permitting insulation between electrodes during patterning of the electrodes to be reliably and readily ensured.

It is another object of the present invention to provide a method for manufacturing an organic EL device which is capable of reliably and readily accomplishing insulation between electrodes during patterning of the electrodes.

In accordance with one aspect of the present invention, an organic EL device is provided. The organic EL device includes a substrate, on which first electrodes and second electrodes are arranged. The first electrodes and/or second electrodes are formed to be transparent. The organic EL device also includes an organic EL layer including a luminous layer and arranged on the first electrodes. The second electrodes are arranged on the organic EL layer. The organic EL device further includes electrode separation sections arranged so as to separate the second electrodes from each other while insulating them from each other and each including a plurality of insulating ribs juxtaposed to each other at predetermined intervals. The electrode separation sections are arranged on the first electrodes or in proximity to a periphery of the first electrodes.

In a preferred embodiment of the present invention, the ribs each have an aspect ratio in section thereof set to be 1 to 5.

In a preferred embodiment of the present invention, the ribs are so formed that upper ends of side walls thereof opposite to each other respectively project in directions opposite to each other.

In a preferred embodiment of the present invention, the first electrodes and second electrodes are arranged in a stripe-like and so as to define a matrix in cooperation with each other. The ribs each are arranged between the second electrodes.

In a preferred embodiment of the present invention, the first electrodes and second electrodes each are arranged in a predetermined pattern. The ribs are arranged around the second electrodes to which a voltage are concurrently applicable.

In a preferred embodiment of the present invention, an insulating layer is formed on the substrate and around the first electrodes so as to expose a desired luminous section.

In accordance with another aspect of the present invention, a method for producing an organic EL device which includes first and second electrodes, an insulating substrate, and an organic EL layer including a luminous layer and arranged on the first electrodes, wherein the first electrodes and/or second electrodes are formed to be transparent, the first electrodes are arranged on the insulating substrate, and the second electrodes are formed on the organic EL layer is provided. The method includes the steps of arranging a plurality of ribs on each of electrode separation sections for separating the second electrodes from each other in a manner to be spaced from each other at predetermined intervals and positioned on the first electrodes and in proximity to a periphery of the first electrodes, laminating the organic EL layer on the first electrodes from above the ribs, and depositing the second electrodes on the organic EL layer from above the ribs.

BRIEF DESCRIPTION OF THE DRAWINGS

These and other objects and many of the attendant advantages of the present invention will be readily appreciated as the same becomes better understood by reference to the following detailed description when considered in connection with the accompanying drawings: wherein.

DETAILED DESCRIPTION OF THE PREFERRED EMBODIMENT

Now, the present invention will be described in detail with reference to FIGS. 1 to 5(b).

Figure 1:
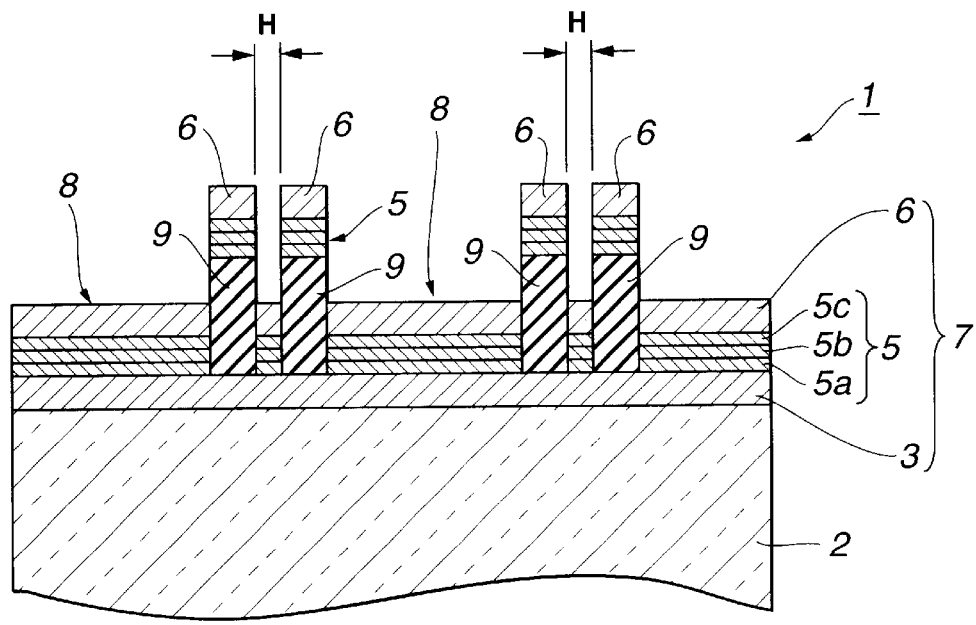
FIG. 1 is a sectional side elevation view showing an embodiment of an organic EL device according to the present invention.
Figure 2:
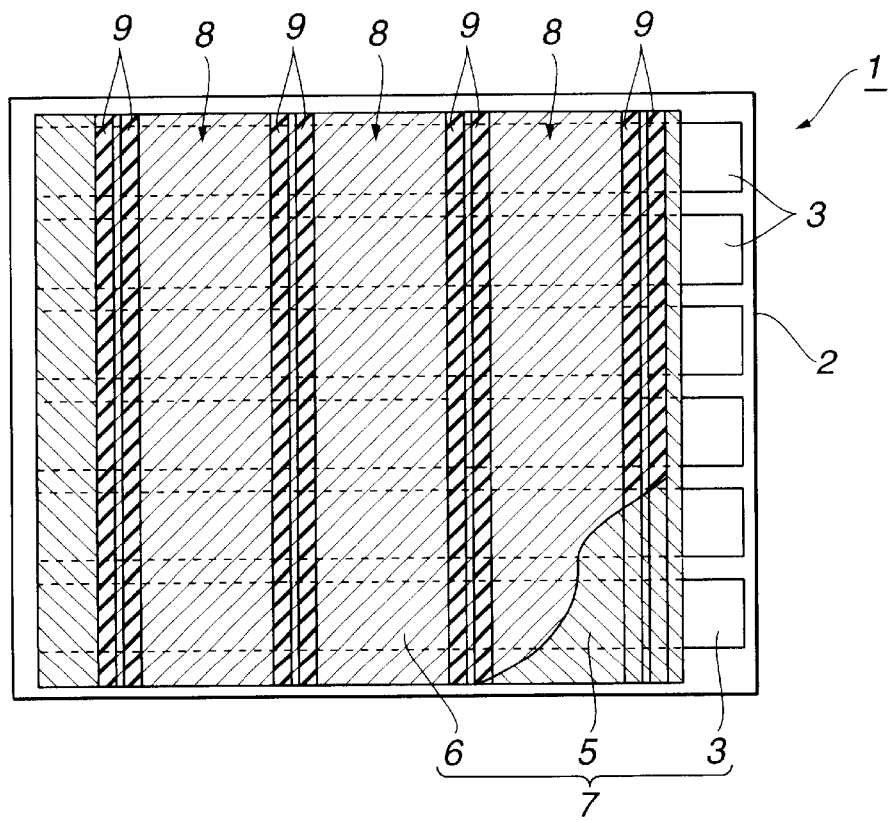
FIG. 2 is a partially cutaway plan view of the organic EL device shown in FIG. 1.

Referring first to FIGS. 1 and 2, an embodiment of an organic EL device according to the present invention is illustrated. An organic EL device of the illustrated embodiment generally designated at reference numeral 1, as shown in FIGS. 1 and 2, includes a substrate 2 of a rectangular shape which is formed of a transparent insulating material such as glass or the like and adapted to act as a base. The substrate 2 is provided thereon with a transparent conductive film, which is made of indium tin oxide (ITO) or the like. The transparent conductive film is formed into a thickness of about 100 nm (for example, 150 nm) by physical vapor deposition (PVD) such as vacuum deposition, sputtering or the like. Then, the transparent conductive film is subject to etching using a photoresist pattern, to thereby be patterned into a predetermined pattern configuration, resulting in anodes 3 which act as first electrodes being formed.

In the illustrated embodiment, the anodes 3, as shown in FIG. 2, are arranged so as to be spaced from each other at predetermined intervals in a stripe-like manner. Also, the anodes 3 each are formed so as to extend at an end thereof to an end of the substrate 2 and connected to a drive circuit (not shown).

Figure 3A:
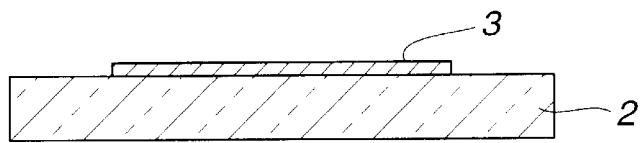
FIGS. 3(a) to 3(h) each are a sectional side elevation view showing each of steps in manufacturing of the organic EL device shown in FIG. 1.
Figure 3B:
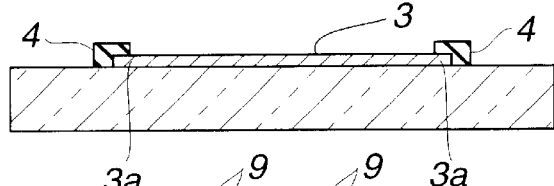

The substrate 2 is formed thereon with an insulating layer 4 so as to surround an edge section 3a defined around a pattern formed by the anodes 3, as shown in FIG. 3(b). The insulating layer 4 is made of a photosensitive polyimide material, $SiO_2$ or the like. When the photosensitive polyimide is used for the insulating layer 4, it is formed into a film by spin coating, which is then selectively exposed to ultraviolet rays, resulting in a desired region being formed. Then, the film is developed and heated, leading to formation of the insulating layer 4. The insulating layer 4 thus formed functions to form a luminous section on each of the anodes 3, cover fine projections formed on the edge section 3a during patterning of the anodes 3 and prevent short-circuiting between the anodes 3 (positive electrodes) and cathodes (negative electrodes) described hereinafter due to concentration of an electric field at the edge section 3a.

The anodes 3 are formed thereon with an organic EL layer 5 laminatedly or by lamination. The organic EL layer 5 is made of an organic compound and includes a luminous layer. The organic EL layer 5 is deposited in the form of a thin film by PVD such as, for example, molecular beam deposition, resistance heating or the like.

In the illustrated embodiment, the organic EL layer 5, as shown in FIG. 1, is constructed into a three-layer structure. More specifically, it includes a CuPc organic film 5a made in the form of a film having a thickness of several nm to tens of nm (for example 40 nm) so as to act as a hole transport layer and arranged on the anodes 3. Also, the organic EL layer 5 includes an organic film 5b formed of α-NPD (N,N'-bis-(1-naphthyl)-N,N'-diphenyl benzidine) so as to have a thickness of tens of nm (for example, 20 nm) and arranged on the CuPc organic film 5a so as to act as a hole transport layer. Further, the organic EL layer 5 includes an Alq$_3$ organic layer 5c made in the form of a film having a thickness of tens of nm (for example, 50 nm) and arranged on the α-NPD organic layer 5b so as to act as both a luminous layer and an electron injection layer.

Alternatively, the organic EL layer 5 may be constructed of only a luminous layer or a combination of the luminous layer and a charge transport layer (a hole transport layer, a hole injection/transport layer, an electron injection layer, an electron injection/transport layer or the like). More particularly, it may be constructed into, for example, a single layer structure including only the luminous layer, a two-layer structure including the luminous layer and hole transport layer, a two-layer structure including the luminous layer and electron injection layer, a three-layer structure including the hole transport layer, luminous layer and electron injection layer, or the like.

When the organic, EL layer 5 is constructed in such a manner that the luminous layer per se carries out luminescence, the luminous layer may be made of, for example, Alq$_3$, distyryl allylene or the like. Alternatively, when the luminous layer is doped with a separate luminous material (dopant), leading to luminescence of the luminous layer, quinacridon (Qd), a dyestuff for laser or the like may be used as the dopant.

The electron injection layer may be made of an elemental metal material decreased in work function such as, for example, Li, Na, Mg, Ca or the like or an alloy material decreased in work function such as Al—Li, Mg—In, Mg—Ag, LiF or the like in order to facilitate injection of electrons thereinto.

The organic EL layer 5, as shown in FIG. 1, is formed thereon with cathodes 6, which are formed of a thin metal film so as to act as a second electrode. The cathodes 6 are made of an elemental metal material decreased in work function such as Al, Li, Mg, Ag, In or the like or an alloy material reduced in work function such as Al—Li, Mg—Ag or the like. The cathodes 6 are made in the form of a film having a thickness between tens of nm and hundreds of nm (for example, 100 nm) by PVD such as molecular beam deposition, resistance heating or the like and arranged in a predetermined pattern.

In the illustrated embodiment, the cathodes 6, as shown in FIG. 2, are formed so as to be spaced from each other at predetermined intervals in a stripe-like manner while extending in a direction perpendicular to the anodes 3, resulting in cooperating with the anodes 3 to define a matrix. The anodes 3, organic EL layer 5 and cathodes 6 cooperate together to provide an element 7 having a thickness of 1 nm to hundreds of nm and more specifically 0.2 to 0.3 μm. Thus, a portion of the organic EL layer 5 defined at a position at which each of the anodes 3 and each of the cathodes 6 overlap each other provides a luminous section 8. The cathodes 6 each are led out at an end thereof to an end of the substrate 2, resulting in being connected to a drive circuit (not shown).

In order to attain patterning of the cathodes 6 described above, the anodes 3 are provided thereon with a plurality of ribs 9 so as to be positioned at each of electrode separation regions or, in the illustrated embodiment, cathode separation regions at which the cathodes are separated from each other for insulation. In the illustrated embodiment, two such ribs 9 are juxtaposed to each other at each of the electrode separation regions so as to be spaced from each other at a predetermined interval H, as shown in FIGS. 1 and 2. The ribs 9 may be made of an insulating material such as a photosensitive polyimide material, a photosensitive resist, a photosensitive dry film, SiO$_2$ or the like. In formation of the photosensitive polyimide, photosensitive resist or photosensitive dry film into the rib 9, the material is formed into a film by spin coating. Then, the film is selectively irradiated with ultraviolet rays to obtain desired regions, followed by development. The photosensitive polyimide of the film is then subject to a heat treatment, resulting in being converted from a precursor thereof into polyimide. SiO$_2$ is formed into a film by chemical vapor deposition (CVD) and then formed thereon with a photosensitive resist film by spin coating, followed by irradiation of ultraviolet rays and development, resulting in a pattern of the photosensitive resist film pattern being formed. Then, the pattern is masked to subject the SiO$_2$ film to etching and then the resist is peeled, resulting in the rib 9 being formed. Alternatively, the SiO$_2$ film may be formed directly on the substrate 2 by means of a mask by PVD such as EB deposition, sputtering or the like.

Also, in the illustrated embodiment, the stripe-like cathodes 6 and stripe-like anodes 3, as described above, are arranged so as to extend in directions perpendicular to each other to define the matrix. Thus, the ribs 9 each are arranged on the anodes 3 so as to extend, perpendicularly to the anodes 3 while intersecting the anodes 3.

Then, the ribs 9 thus formed on the anodes 3 have the cathodes 6 deposited thereon through the organic EL layer 5, so that the cathodes 6 may be separated from each other through a gap of the interval H defined between the ribs 9 juxtaposed to each other. This permits the cathodes 6 to be insulated from each other and arranged in a predetermined pattern.

The ribs 9 juxtaposed to each other each preferably have an aspect ratio (height/width) of 1 to 5 and preferably 2. More particularly, the rib preferably has dimensions of 1 to 100 μm (for example, 10 μm) in width and 1 to 200 μm (for example, 20 μm) in height. Also, the interval H between the ribs 9 is not limited to any specific size. However, the interval H is desirably minimized to prevent short-circuiting between the cathodes 6 due to intrusion of the cathode material therebetween. For example, the rib 9 may have a width of 10 μm and a height of 20 μm and the interval H may be formed into a size as small as 10 μm. Also, an increase in the number of ribs 9 juxtaposed to each other permits an increase in the number of intervals H through which the cathodes are separated from each other. However, excessive arrangement of the ribs 9 causes space efficiency to be deteriorated, thus, the interval H between the ribs 9 is desirably minimized. For example, the interval H as small as 5 to 50 μm is advantageous.

Figure 3C:
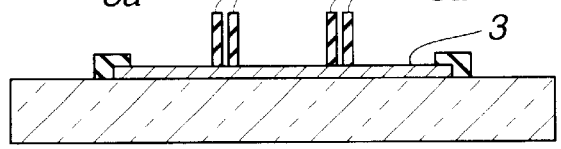
Figure 3D:
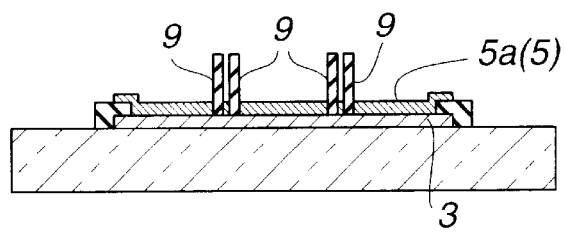
Figure 3E:
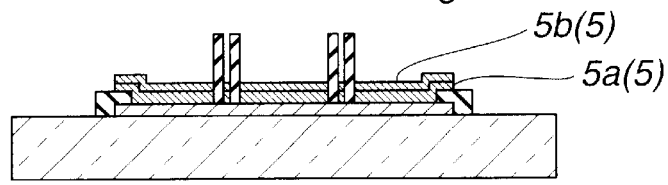
Figure 3F:
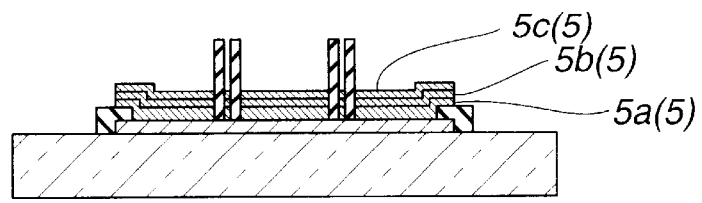
Figure 3G:
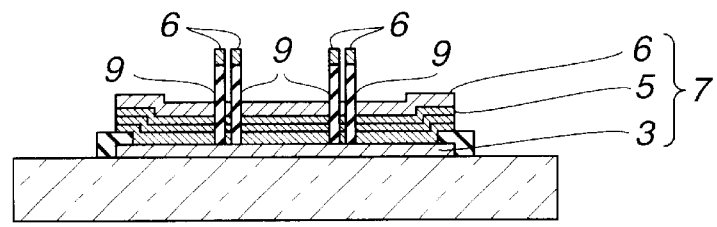
Figure 3H:
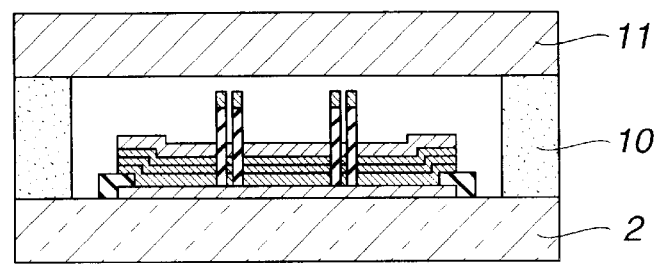

The substrate 2 on which the element 7 is thus formed is fixedly mounted thereon with a seal substrate 11 of a rectangular shape through a sealant or seal film 10 arranged on an outer periphery of the substrate 2, as shown in FIG. 3(h). Mounting of the seal substrate 11 on the substrate 2 is carried out in a dry atmosphere such as dry inert gas (for example, dry nitrogen), dry air or the like from which a moisture is substantially removed. The sealant 10 may be constituted by an organic adhesive such as an ultraviolet curing agent, thermosetting resin such as epoxy resin or the like. The seal substrate 11 may be made of, for example, metal, glass, ceramic, resin, porcelain enamel or the like. The seal substrate 11 functions to protect the anodes 3, organic EL layer 5 and cathodes 6.

In the organic EL device 1 constructed as described above, when a drive voltage is applied between the anodes 3 and the cathodes 6 from the drive circuit (not shown) to permit a constant current to flow therethrough, the organic EL layer 5 has positive holes injected therein to from the anodes 3 and electrons injected thereinto from the cathodes 6. Then, the positive holes and electrons thus injected are recombined with each other in the organic EL layer 5 to produce excitons, so that the organic EL layer may exhibit desired display due to emission of light from the excitons upon deactivation thereof. Such luminescence of the organic EL layer 5 is observed from an outside of the substrate 2 through the anodes 3 which are transparent.

Now, manufacturing of the organic EL device 1 will be described with reference to FIGS. 3(a) to 3(h).

Manufacturing of the organic EL device 1 is started by arranging the substrate 2 in a chamber (not shown) and forming the transparent conductive film 3 of, for example, 150 nm in thickness on a surface of the substrate 2. Then, the transparent conductive film 3 is subject to etching using a photoresist pattern to form the stripe-like anodes 3, as shown in FIG. 3(a).

The transparent conductive film 3 may be formed by sputtering commonly practiced in the art. However, the sputtering causes the transparent conductive film 3 formed to be polymerized, resulting in flake-like ruggedness being formed on the surface of the transparent conductive film 3 due to a crystal grain boundary of the polymerized transparent conductive film 3. Thus, the transparent conductive film 3 is preferably formed while being kept noncrystalline or amorphous. For example, use of an amorphous transparent conductive film commercially available under a tradename Idemitsu Indium X-Metal Oxide from Idemitsu Kosan Kabushiki Kaisha for formation of the transparent conductive film permits it to exhibit satisfactory denseness and surface smoothness.

Also, the transparent conductive film 3 made of a noncrystalline transparent conductive film such as IDIXO or the like may be subject to mask deposition for desired patterning of the anodes 3 during the formation. Alternatively, the transparent conductive film may be subject to patterning by conventional photolithography after formation thereof.

Then, after the anodes 3 are thus formed, the insulating layer 4 is deposited in the form of a film of, for example, 1 μm in thickness on the substrate 2 so as to cover the edge section 3a defined around the pattern of the anodes 3. Formation of the insulating layer 4 may be carried out by spin coating. Then, the insulating layer 4 is selectively exposed to irradiation of ultraviolet rays, resulting in desired regions being obtained. Then, it is developed and subject to a treatment for imide formation. This permits the insulating layer 4 to provide the luminous section 8 associated with the anodes 3.

Then, formation of the ribs 9 is carried out. The ribs 9 are so arranged that a plurality of the ribs 9 (for example, two such ribs 9) are juxtaposed to each other at each of the electrode or cathode separation regions so as to be spaced from each other at the predetermined interval H (for example, 10 μm). The ribs 9 each are formed into dimensions of 10 μm in width and 20 μm in height so that an aspect ratio (height/width) thereof is, for example, 2. The rib 9 is made in the form of a film by spin coating and then selectively irradiated with ultraviolet rays, to thereby be formed into a predetermined pattern. Subsequently, the film is developed and subject to a treatment for imide formation, as shown in FIG. 3(c).

Thereafter, the organic, EL layer 5 is provided in the form of a film on the anodes 3 by PVD such as molecular beam deposition, resistance heating or the like. For this purpose, The anodes 3 are formed thereon with the CuPc organic film 5a so that the film may have a thickness of, for example, 40 nm, as shown in FIG. 3(d). Then, the α-NPD organic film 5b is formed in a thickness of, for example, 20 nm on the CuPc organic film 5a, as shown in FIG. 3(e). Then, the Alq$_3$ organic film 5c is formed in a thickness of, for example, 50 nm on the α-NPD organic film 5b, as shown in FIG. 3(f), resulting in the organic EL layer 5 being obtained.

Subsequently, the cathodes 6 each are formed of Al—Li and deposited in the form of a thin metal film on the organic EL layer 5 by PVD. The cathodes 6 are formed in a stripe-like manner and so as to extend in a direction perpendicular to the anodes 3. The cathodes 6 are deposited in a thickness of, for example, 100 nm. During the deposition, the cathodes 6 are separated from each other through the gap of the interval H defined between the ribs 9 juxtaposed to each other, resulting in being arranged in a stripe-like manner while being insulated from each other, as shown in FIG. 3(g). This results in the substrate 2 being formed thereon with the element 7 wherein the organic EL layer 5 is laminatedly interposed between the paired electrodes (anodes 3 and cathodes 6) constituting a matrix.

Then, an adhesive is applied to a predetermined position on the seal substrate 11 or a position in proximity to an outer periphery of the seal substrate 11, to thereby form the sealant or seal film 10 on the seal substrate 11. Then, the substrate 2 is put on the seal substrate 10 while keeping the element 7 facing a surface of the seal substrate 11 on which the seal film 10 is formed. Then, load at a predetermined level is applied to the substrate 2 and seal substrate 11 by means of any suitable loading means such as an elastic clip or the like, to thereby provide an assembly. Thereafter, the assembly is irradiated with ultraviolet rays through the substrate 2. This permits curing of the seal film 10, so that an interval between the substrate 2 and the seal substrate 11 may be kept constant by the seal film 10, resulting in the organic EL device 1 being finished as shown in FIG. 3(h).

As described above, the ribs 9 are kept juxtaposed to each other at each of the electrode separation regions with the predetermined interval H being formed therebetween during deposition of the cathodes 6. This permits movement of a material for the cathodes 6 from an upper surface of each rib 9 toward a side surface thereof to be blocked by the gap of the interval H between the ribs 9. This ensures that the cathodes 6 partitioned by the ribs 9 juxtaposed to each other may be positively insulated from each other by separation.

Also, formation of the cathodes 6 while keeping the ribs 9 juxtaposed to each other permits the number of side surfaces of the ribs at each of the electrode separation regions to be increased; so that a failure in insulation between the cathodes may be minimized or substantially prevented even when the cathode material is substantially vertically downwardly deposited from right above the ribs 9.

More specifically, it is considered that in order to prevent movement of the cathode material to the side surface of the rib when a single rib is arranged at each of the electrode separation sections as in the prior art, deposition of the cathode material for formation of the cathode is carried out at an angle of 10° or more based on a normal direction of the substrate 2 from one side surface of the rib, to thereby prevent the cathode material from being applied to the other side surface of the rib. On the contrary, juxtaposition of two such ribs 9 to each other in the illustrated embodiment permits the angle described above to be as small as about 5°. Arrangement of three such ribs 9 effectively prevents a failure in insulation between the cathodes even when the angle is reduced to a level as low as 1° to 2°.

Figure 4A:
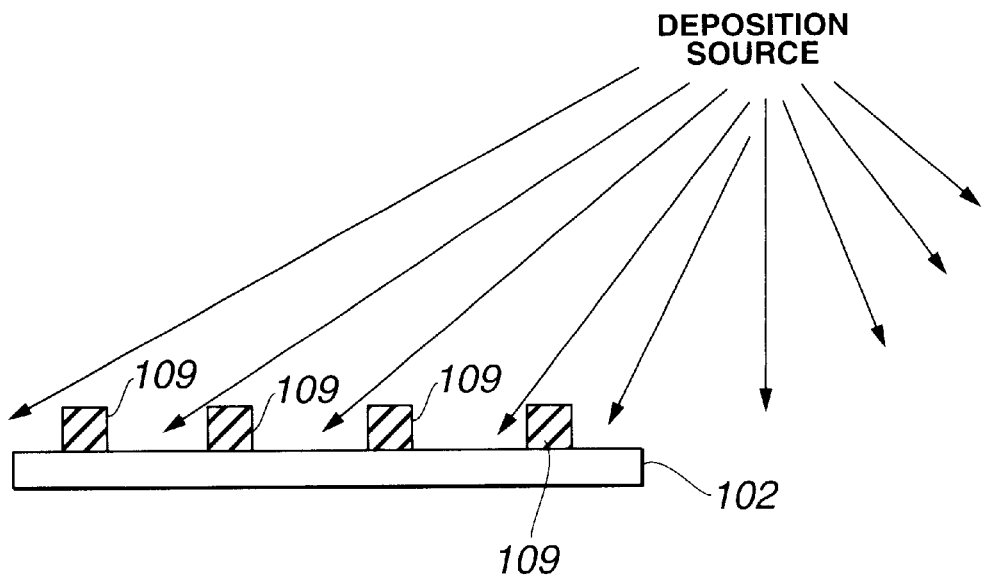
FIGS. 4(a) and 4(b) are diagrammatic views showing deposition in formation of a conventional organic EL device and deposition in formation of an organic EL device of the present invention, respectively.
Figure 4B:
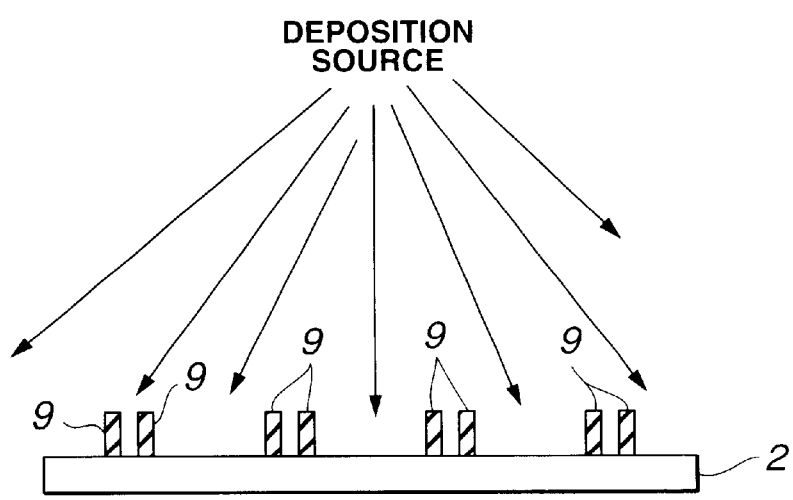

Thus, in order to increase a deposition angle or an angle at which the deposition is carried out, as shown in FIG. 4(a), it is required to arrange the substrate 2 away from a deposition source from which the cathode material is emitted as shown in FIG. 4(a). This causes only apart of the cathode material to be merely utilized for deposition of the cathodes. On the contrary, the illustrated embodiment permits the deposition angle to be significantly reduced, so that the substrate may be positioned right below the deposition source as shown in FIG. 4(b), resulting in the cathode material emitted from the radiation source being effectively utilized for the deposition.

Also, as described above, a reduction in deposition angle of the cathode material in the illustrated embodiment eliminates a necessity of increasing a height of the ribs which is required in the prior art. Thus, the illustrated embodiment permits an aspect ratio (height/width) of the ribs to be within a range of 1 to 5, resulting in manufacturing of the ribs 9 being facilitated.

Further, an increase in deposition angle of the cathode material causes a shade to be formed on the other side surface of the rib as in the prior art, so that the deposition is limited to that from one surface of the rib. Thus, an increase in deposition angle as in the prior art causes a configuration of the rib to be limited to a linear configuration in correspondence to a pattern of the stripe-like cathodes. On the contrary, the illustrated embodiment permits deposition of the cathode material to be carried out vertically downwardly from right above the substrate 2, so that the rib may be formed into any desired configuration in correspondence to a configuration of the cathode pattern such as a cathode pattern constituted by a plurality of segments, a fixed character pattern or the like other than the stripe-like cathode pattern.

Figure 5A:
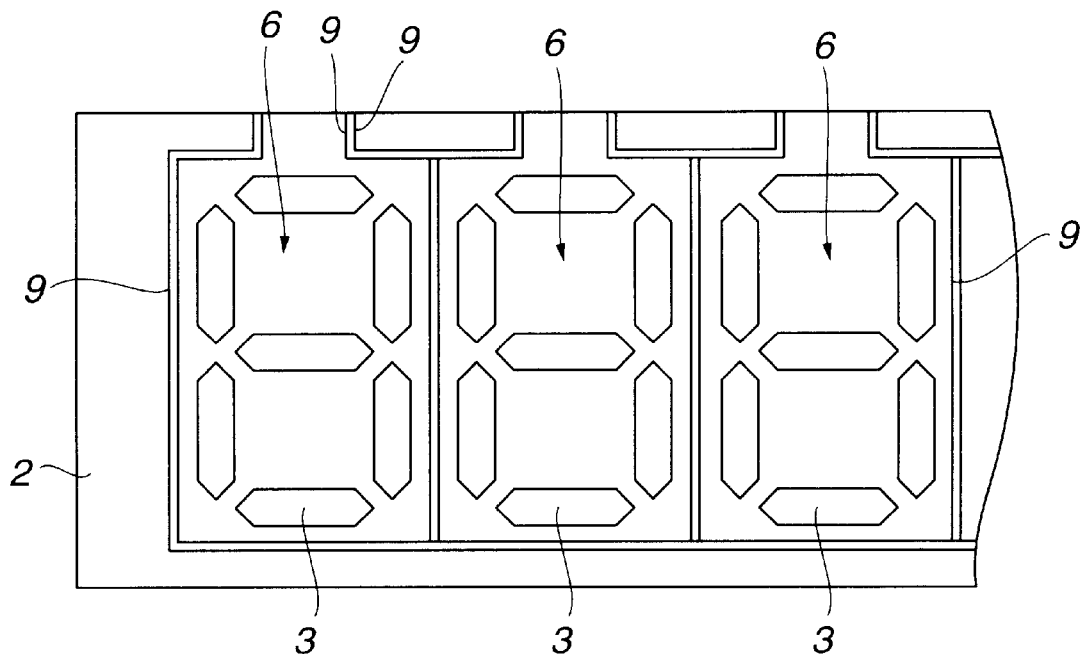
FIGS. 5(a) and 5(b) each are a plan view showing patterning of electrodes and ribs in the present invention by way of example.
Figure 5B:
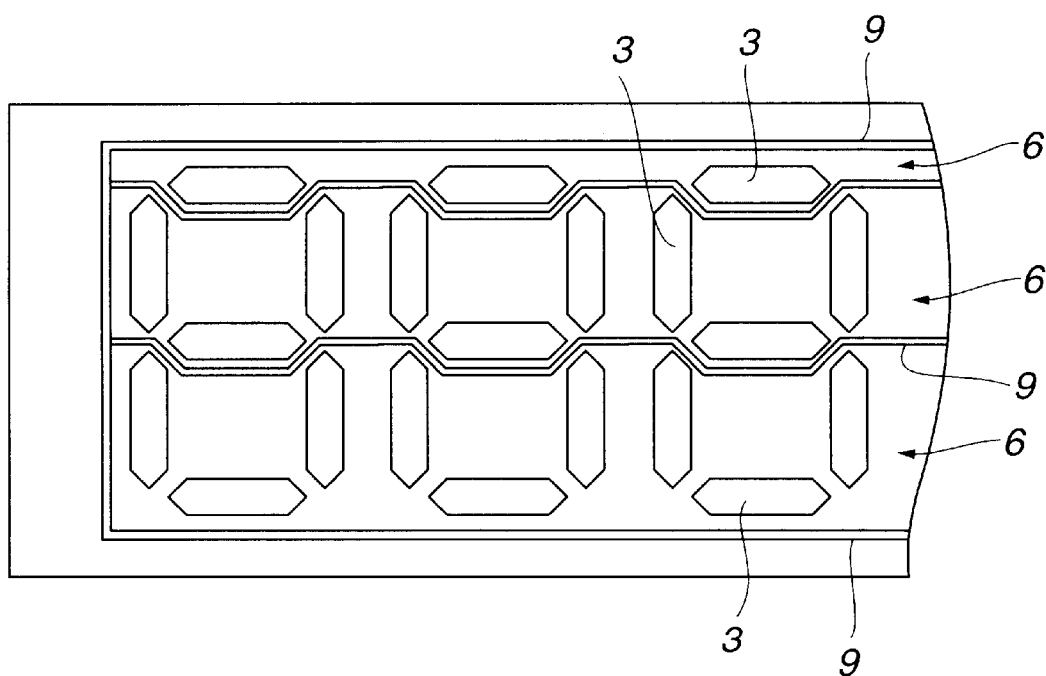
Figure 6:
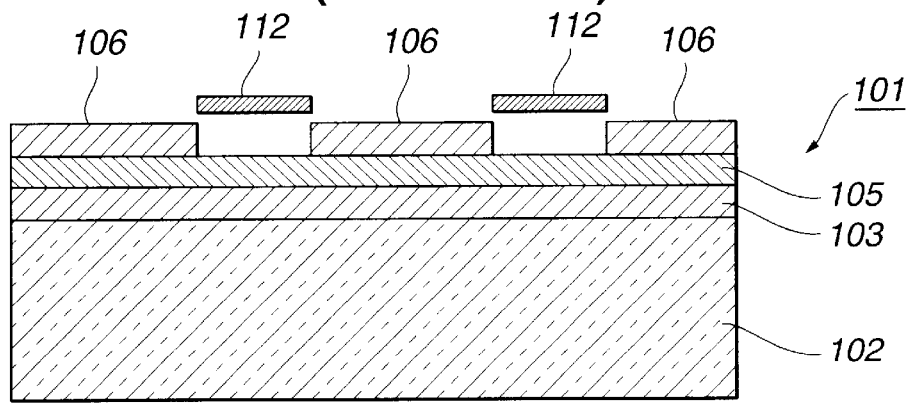
FIG. 6 is a sectional side elevation view showing an example of a conventional organic EL device.
Figure 7A:
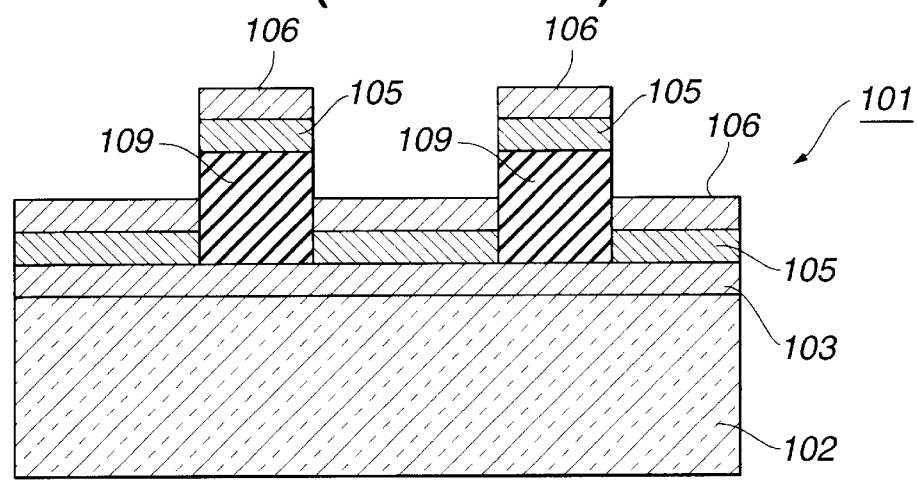
FIGS. 7(a) to 7(c) each are a sectional side elevation view showing another example of a conventional organic EL device.
Figure 7B:
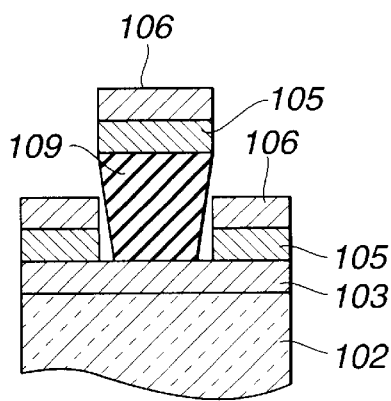
Figure 7C:
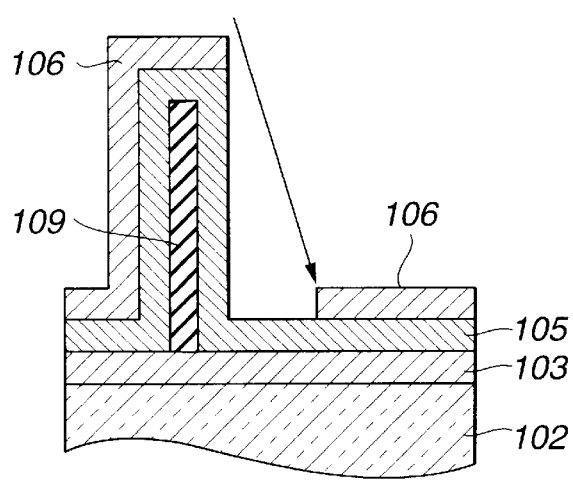

FIGS. 5(a) and 5(b) each show a cathode pattern which may be applied to the illustrated embodiment by way of example. In FIG. 5(a), the anodes 3 are constituted by a plurality of segments arranged in a letter-eight-shaped pattern and correspondingly the cathodes 6 are arranged in a pattern which permits a voltage to be concurrently applied to the segments of each letter-eight-shape pattern. The ribs 9 are arranged around such cathode patterns. In FIG. 5(b), in correspondence to the anodes 3 arranged in a letter-eight-shaped pattern constituted by a plurality of segments, the cathodes 6 are arranged in a pattern which permits a voltage to be concurrently applied to the segments of the anode patterns positionally corresponding to each other. The ribs are arranged in a manner to bend and/or meander along the cathode pattern. The ribs thus arranged permit the cathodes 6 to be freely arranged in any desired pattern while ensuring satisfactory insulation between the cathodes.

In addition, arrangement of the ribs 9 in juxtaposition to each other at each of the electrode separation regions permits the ribs to be formed into any desired configuration. For example, the ribs each may be formed into an invertedly or downwardly tapered shape in section or an inverted L-shape in section wherein upper ends thereof opposite to each other project at an edge thereof in directions opposite to each other. When three or more such ribs are juxtaposed to each other, an intermediate rib interposed between both outermost ribs may be formed into a T-like shape. Such formation permits the gap of the interval H between the ribs juxtaposed to each other to effectively prevent the cathode material from intruding between the ribs 9, leading to an increase in insulation between the cathodes.

In this connection, the prior art has a problem that a lack of the organic EL layer 5 on a portion of the substrate 2 on which the above-described shade is formed causes short-circuiting between the anodes 3 and the cathodes 6. On the contrary, the illustrated embodiment eliminates the problem because the interval H between the ribs juxtapose to each other does not participate in application of a voltage to the cathodes.

However, formation of the ribs into the invertedly tapered shape in section or the like requires an additional complicated step of forming such a shape. Mere juxtaposition of the ribs 9 to each other without forming the ribs into such a complicated shape provides satisfactory insulation between the cathodes. Thus, such juxtaposition accomplished by a simple step is sufficient to permit the illustrated embodiment to effectively exhibit the above-described object of the present invention.

In the illustrated embodiment, the first electrodes formed on the substrate 2 are constituted by the anodes 3 and the second electrodes formed on the organic EL layer 5 are constituted by the cathodes 6, wherein the ribs juxtaposed to each other ensures patterning of the cathodes 6 and insulation thereof. Alternatively, the illustrated embodiment may be so constructed that the first electrodes are constituted by the cathodes 6 and the second electrodes are constituted by the anodes 3, resulting in the ribs 9 juxtaposed to each other ensuring patterning of the anodes 3 and insulation thereof. In this instance, such substitution between the anodes 3 and the cathodes 3 requires that the organic EL layer 5 is constructed into a laminate structure contrary to the laminate structure described above and the seal substrate 11 is made of a transparent material.

As can be seen form the foregoing, the organic EL device of the present invention is so constructed that a plurality of the ribs juxtaposed to each other are arranged at each of the electrode separation regions through which the second electrodes are separated from each other for insulation. Such construction permits the gap of the predetermined interval between the ribs juxtaposed to each other to prevent the material for the second electrodes from advancing through the top surface of the ribs to the side surface thereof, to thereby ensure positive insulation between the second electrodes.

Also, the ribs each have an aspect ratio set to be 1 to 5, resulting in formation of the ribs being facilitated.

Further, the ribs may be formed into a shape which permits the upper ends of the side surfaces of the ribs opposite to each other to project in directions opposite to each other. Formation of the ribs into such a configuration more effectively prevents the material for the second electrodes from moving to the gap between the ribs, to thereby further enhance insulation between the second electrodes.

In addition, juxtaposition of the ribs to each other permits an increase in the number of side surfaces of the ribs, to thereby effectively prevent the material for the second electrodes from moving to the gap between the ribs. This prevents a failure in insulation between the second electrodes even when the material for the second electrodes is deposited on the substrate from right above the substrate. This permits the second electrodes to be arranged in a complicated pattern corresponding to a fine pattern of the first electrodes.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. An organic EL device comprising:

a substrate;

first electrodes and second electrodes arranged on said substrate;

at least one of said first electrodes and second electrodes being formed to be transparent;

an organic EL layer including a luminous layer and arranged on said first electrodes;

said second electrodes being arranged on said organic EL layer and a plurality of insulating ribs arranged so as to separate said second electrodes from each other while insulating said second electrodes from each other, each of said insulating ribs being split into at least two pieces and juxtaposed to each other at predetermined intervals.

2. An organic EL device as defined in claim 1, wherein said ribs each have an aspect ratio in section thereof set to be 1 to 5.

3. An organic EL device as defined in claim 1 or 2, wherein said ribs are so formed that upper ends of side walls thereof opposite to each other respectively project in directions opposite to each other.

4. An organic EL device as defined in any one of claims 1 to 3, wherein said first electrodes and second electrodes are arranged in a stripe-like and so as to define a matrix in cooperation with each other; and said ribs each are arranged between said second electrodes.

5. An organic EL device as defined in any one of claims 1 to 3, wherein said first electrodes and second electrodes each are arranged in a predetermined pattern; and said ribs are arranged around said second electrodes to which a voltage are concurrently applicable.

6. An organic EL device as defined in any one of claims 1 to 5, further comprising an insulating layer formed on said substrate and around said first electrodes so as to expose a desired luminous section.

7. A method for producing an organic EL device, comprising the steps of:

providing an insulating substrate;

forming first electrodes on said insulating substrate;

forming a plurality of ribs on said first electrodes for defining electrode separation sections on said EL device, each of said ribs being split into at least two pieces and spaced from each other at predetermined intervals;

laminating an organic EL layer including a luminous layer on said first electrodes from above said ribs; and depositing second electrodes on said organic EL layer from above sad ribs.

* * * * *